US006667638B1

(12) United States Patent
Kramer et al.

(10) Patent No.: US 6,667,638 B1
(45) Date of Patent: Dec. 23, 2003

(54) APPARATUS AND METHOD FOR A FREQUENCY DIVIDER WITH AN ASYNCHRONOUS SLIP

(75) Inventors: Paul Joseph Kramer, Fort Collins, CO (US); Jered Michael Sandner, Wellington, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/251,469

(22) Filed: Sep. 20, 2002

(51) Int. Cl.$^7$ .............................................. H03K 21/00

(52) U.S. Cl. ...................................... 327/115; 327/117

(58) Field of Search ................................ 327/115, 117; 377/47, 48

(56) References Cited

U.S. PATENT DOCUMENTS 6,255,882 B1 * 7/2001 Hirai .......................... 327/291

* cited by examiner

Primary Examiner—Kenneth B. Wells
(74) Attorney, Agent, or Firm—Merchant & Gould PC; Joshua W. Korver

(57) ABSTRACT

A frequency divider circuit utilizes an asynchronous slip request signal to provide an output clock signal according to a programmable divide ratio "R". A high frequency input clock signal has a frequency divided by a first factor to produce a divided signal when a slip signal is inactive. The output clock signal is produced by functionally dividing the frequency of the divided signal by a second factor. The second factor is determined by the programmable divide ratio divided by the first factor such that the frequency of the output clock signal is related to the frequency of the input clock signal and the programmable divide ratio. An asynchronous slip request signal is generated when the programmable divide ratio is a non-multiple of the first factor. The asynchronous slip request signal activates the slip signal such that a transition of the divided signal is skipped.

20 Claims, 4 Drawing Sheets

APPARATUS AND METHOD FOR A FREQUENCY DIVIDER WITH AN ASYNCHRONOUS SLIP

FIELD OF THE INVENTION

The present invention relates to the field of frequency divider circuits, and in particular, to a frequency divider circuit using an asynchronous slip request signal to divide a clock signal according to a programmable divide ratio.

BACKGROUND OF THE INVENTION

Certain circuits utilize clock signals of various frequencies to provide a specified functionality. Often, the various frequency clock signals are produced from an input clock signal generated by a phase-locked loop circuit or other clock generation circuit. The input clock signal is used to produce the clock signals having lower frequencies. The frequencies of the generated clock signals depend upon the applications in which the clock signals are used.

For example, in display applications, clock signals of different frequencies provide the horizontal and vertical synchronization signals, the pixel clock signal, as well as other signals for producing an image on a screen. These signals are often phase-aligned with one another to ensure the integrity of the image on the screen. As display applications improve, these signals are required to operate at higher and higher frequencies.

Synchronous counters are often used in a frequency divider circuit to divide the input clock signal to produce the other signals necessary for display applications. Synchronous counters provide a relatively simple architecture for dividing a clock signal to achieve other signals of lower frequencies. Certain synchronous counters allow for a programmable divide ratio so that a clock signal may be divided by a chosen factor.

A possible limitation of synchronous counters is the ability to divide signals above a certain frequency. Since the operational frequencies of display circuits as well as other circuits continue to increase, it will be appreciated that enabling a high frequency signal to be divided by a programmable divide ratio allows for increased performance of these circuits.

SUMMARY OF THE INVENTION

The present invention is directed to a frequency divider circuit that utilizes an asynchronous slip request signal to divide a high frequency clock signal by a programmable divide ratio "R". The frequency divider circuit divides the frequency (F) of input clock signal by factor of 2 to produce a divided, or half-frequency signal. A synchronous counter of the frequency divider circuit functionally divides the half-frequency signal according to the programmable divide ratio over 2 ("R/2"). Accordingly, the frequency divider circuit produces a desired output clock signal of a predetermined frequency according to the programmable divide ratio (e.g. "F/R"). To compensate for the odd divide ratios, an asynchronous slip request signal is produced by the frequency divider circuit. An instance of the asynchronous slip signal notifies the frequency divider circuit to skip a transition of the half-frequency signal. Accordingly, the half-frequency signal has an odd number of transitions for each pulse of the output clock signal. The ability to generate both the odd and even divide ratios after the input clock signal is divided by a factor of 2, results in an output clock signal of various frequencies that is produced from an input clock signal of a high frequency according to a programmable divide ratio.

In addition, certain portions of the frequency divide circuit may be cascaded such that the input clock signal may be further divided to lower its frequency to a usable level. The frequency of the input clock signal may be continually divided until it reaches a level usable by a synchronous counter. A separate asynchronous slip request signal is generated by the frequency divider circuit for each division of the input clock signal frequency. The asynchronous slip request signals maintain the ability to generate an output clock signal having a frequency corresponding to both even and odd divide ratios of the input clock signal frequency. Accordingly, an output clock signal is produced that has a frequency corresponding to a programmable divide ratio of a high frequency input clock signal.

In accordance with one aspect of the invention, a method for dividing the frequency of an input clock signal according to a programmable divide ratio includes dividing the frequency of the input clock signal by a first factor to produce a divided signal, when a slip signal is inactive. The output clock signal is produced by functionally dividing the frequency of the divided signal by a second factor. The second factor is determined by the programmable divide ratio divided by the first factor such that the frequency of the output clock signal is related to the frequency of the input clock signal and the programmable divide ratio. An asynchronous slip request signal is generated when the programmable divide ratio is a non-multiple of the first factor. The asynchronous slip request signal activates the slip signal such that a transition of the divided signal is skipped.

In accordance with yet another aspect of the invention, a pulse is generated in response to the asynchronous slip request signal that has a width of a period of the input clock signal. A transition of the divided signal is skipped in response to the pulse, such that for each asynchronous slip request signal, a single transition of the divided signal is skipped. A half-frequency signal is produced by toggling between a high logic level and low logic level for each period of the input clock signal. The half-frequency signal holds state in response to the asynchronous slip request signal.

In accordance with still another aspect of the invention, additional half-frequency signals may be produced. Additional toggle circuits toggle between a high logic level and low logic level for each period of each proceeding half-frequency signal. Each additional toggle circuit produces a half-frequency signal. The last toggle circuit produces a signal that corresponds to the divided signal. A counter circuit produces a count signal that increments to a factor. The factor corresponds to the most significant bits of the programmable divide ratio. After counting to the factor, the counter circuit is reset. A pulse occurs on the output clock signal after the count signal reaches the factor. Additionally, the asynchronous slip request signal is produced when the least significant bit of the programmable divide ratio is a high logic level and the count signal has reached a predetermined value.

In accordance with another aspect of the invention, an apparatus for dividing a first frequency of an input clock signal according to a programmable divide ratio includes a half-frequency circuit and a divide ratio circuit. The half-frequency circuit is arranged to produce a half-frequency signal in response to the input clock signal when the slip signal is inactive. The half-frequency signal corresponds to a divide signal that has a second frequency that is determined by the first frequency divided by a base multiple.

The half-frequency circuit includes a synchronizer circuit, a one-shot generator, and a toggle circuit. The synchronizer circuit is arranged to synchronize the asynchronous slip request signal with the input clock signal. The one-shot generator is arranged to produce a slip signal associated with the asynchronous slip request signal. The toggle circuit is arranged to produce the divide signal. The divide signal toggles for each period of the input clock signal in response to the input clock signal and the slip signal. The divide signal skips a toggle in response to a pulse of the slip signal.

The divide ratio circuit is arranged to produce an output clock signal and at least one asynchronous slip request signal. The asynchronous slip request signal assists in causing a skip of at least one transition of the divided signal when the programmable divide ratio is another multiple other than the base multiple. The output clock signal has an associated third frequency corresponding to a programmable divide ratio of the first frequency.

The divide ratio circuit includes a counter circuit, a first and second comparator circuit, and a first and second logic circuit. The counter circuit is arranged to produce a count signal dependent on the programmable divide ratio. The first comparator circuit is arranged to compare the count signal to the most significant bits of the programmable divide ratio. The second comparator is arranged to compare the count signal to a predetermined value. The first logic circuit is arranged to produce the output clock signal in response to the comparison of the first comparator circuit. The second logic circuit is arranged to produce the asynchronous slip request signal in response to the comparison of the second comparator circuit and the least significant bit of the programmable divide ratio.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

The present invention comprises a frequency divider circuit that utilizes an asynchronous slip to generate a clock signal of lower frequency from another, higher frequency clock signal. The circuit takes an input clock of frequency "F" and outputs a slower clock of frequency "F/R", where "R" is a programmable divide ratio. The frequency divider circuit initially divides the input clock signal by a first factor of 2. The resultant half-frequency signal is divided again by a second factor of "R/2". To achieve odd divide ratios, the frequency divider circuit is asynchronously notified to skip a transition of the half-frequency signal.

Figure 1:
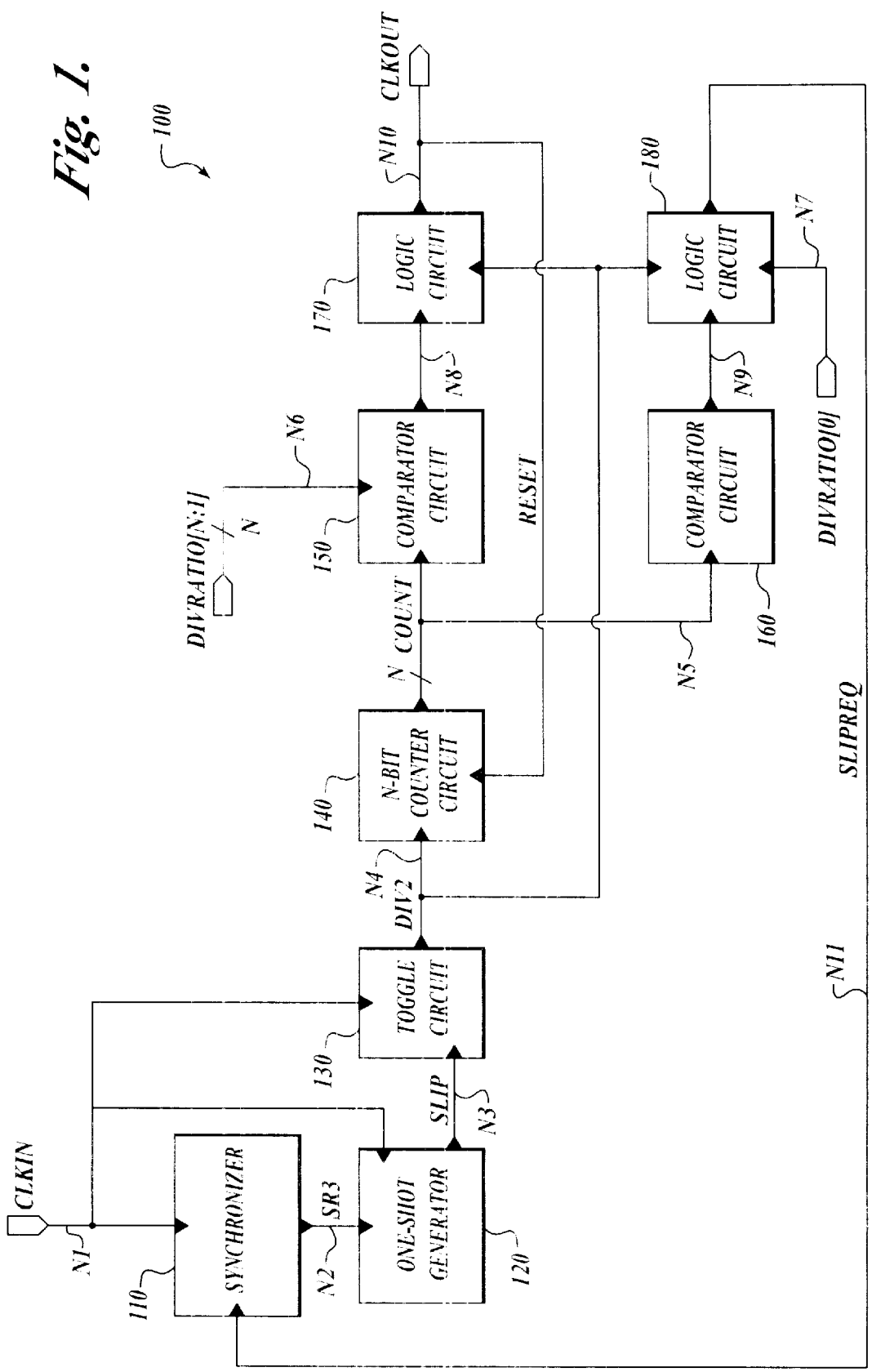
FIG. 1 illustrates an exemplary embodiment of a frequency divider circuit.

FIG. 1 illustrates an exemplary embodiment of a frequency divider circuit. Frequency divider circuit 100 includes synchronizer circuit 110, one-shot generator 120, toggle circuit 130, N-bit counter circuit 140, comparator circuits 150 and 160, and logic circuits 170 and 180.

Synchronizer circuit 110 includes a first input that is coupled node N1, a second input that is coupled to node N11, and an output that is coupled to node N2. One-shot generator 120 includes a first input that is coupled to node N1, a second input that is coupled to node N2, and an output that is coupled to node N3. Toggle circuit 130 includes a first input that is coupled to node N1, a second input that is coupled to node N3, and an output that is coupled to node N4. N-bit counter circuit 140 includes a first input that is coupled to node N4, a second input that is coupled to node N10, and an output that is coupled to node N5. Comparator circuit 150 includes a first input that is coupled to node N5, a second input that is coupled to node N6, and an output that is coupled to node N8. Comparator circuit 160 includes an input that is coupled to node N5 and an output that is coupled to node N9. Logic circuit 170 includes a first input that is coupled to node N8, a second input that is coupled to node N4, and an output that is coupled to node N10. Logic circuit 180 includes a first input that is coupled to node N9, a second input that is coupled to node N7, a third input that is coupled to node N4, and an output that is coupled to node N11.

In operation, synchronizer circuit 110 produces an output signal (sr3) at node N2 in response an asynchronous slip request signal (slipreq) at node N11 when activated by the input clock signal (CLKin) at node N1. Synchronizer circuit 110 synchronizes the input clock signal (CLKin) and the asynchronous slip request signal (slipreq) such that the output of synchronizer circuit 110 is phase-aligned with the input clock signal (CLKin). Synchronize circuit 110 reduces the potential of meta-stability occurring within frequency divider circuit 100, as is further described below in the discussion of FIG. 2.

One-shot generator 120 receives the output (sr3) of synchronizer circuit 110 and produces an output (slip) at node N3 when activated by the input clock signal (CLKin) from node N1. One-shot generator 120 ensures that a single pulse is produced at node N3 for each instance that the asynchronous slip request signal (slipreq) transitions to a high logic level (logic "1").

Toggle circuit 130 produces an output signal (div2) at node N4 in response to the signal (slip) at node N3 when activated by the input clock signal (CLKin). Toggle circuit 130 operates similar to a divide-by-two circuit when the slip signal is at a low logic level (logic "0"), dividing the frequency of the input clock signal (CLKin) by a factor of 2. Accordingly, the output (div2) of the toggle circuit 130 is a clock signal with half the frequency of the input clock signal (CLKin), or a half-frequency signal.

N-bit counter circuit 140 produces a N-bit count, or count signals (count) at node N5 in response to the half-frequency signal (div2) and a reset signal (reset) from node N10. It is appreciated that N-bit counters of various architectures may be used.

Comparator circuit 150 produces an output signal at node N8 in response to a comparison of the N-bit count (count) at node N5 and the most significant bits of a divide ratio signal (divratio[N: 1]) at node N6.

Comparator circuit 160 produces an output signal at node N9 in response to a comparison of the N-bit count (count) at node N5 to a predetermined number (e.g., M). In one embodiment, "M" corresponds to a value chosen to be less than the lowest value for the most significant bits of the divide ratio signal (divratio[N: 1]). "M" ensures that an asynchronous slip request signal (slipreq) is generated once for each pulse of the output clock signal (CLKout).

Logic circuit 170 produces an output clock signal (CLKout) at node N10 in response to the signal at node N8 and the half-frequency signal (div2). The frequency of the output clock signal (CLKout) corresponds to the frequency of the input clock signal (CLKin) divided by programmable divide ratio "R".

Logic circuit 180 produces the asynchronous slip request signal (slipreq) at node N11 in response to the signal at node N9, the least significant bit of the divide ratio signal (divratio [0]) at node N7, and the half-frequency signal (div2). A pulse is generated in the asynchronous slip request signal (slipreq) when the least significant bit of the divide ratio signal (divratio[0]) is a high logic level, indicating an odd divide ratio. A pulse in the asynchronous slip request signal (slipreq) notifies the frequency divider circuit (100) to skip a transition of the half-frequency signal (div2), thereby generating the output clock signal (CLKout) according to the programmable divide ratio selected.

Figure 2:
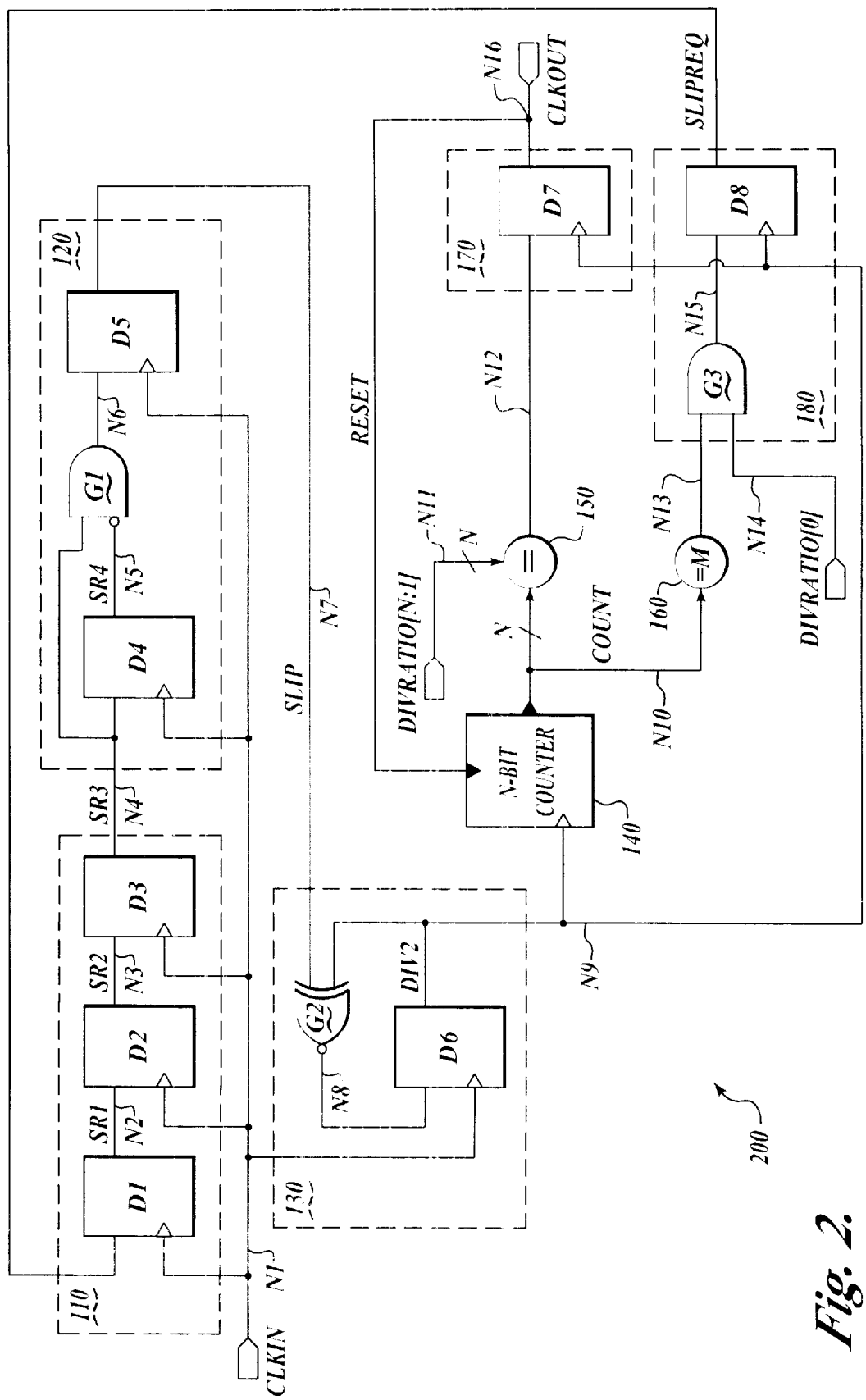
FIG. 2 shows a more detailed exemplary embodiment of a frequency divider circuit.
Figure 3:
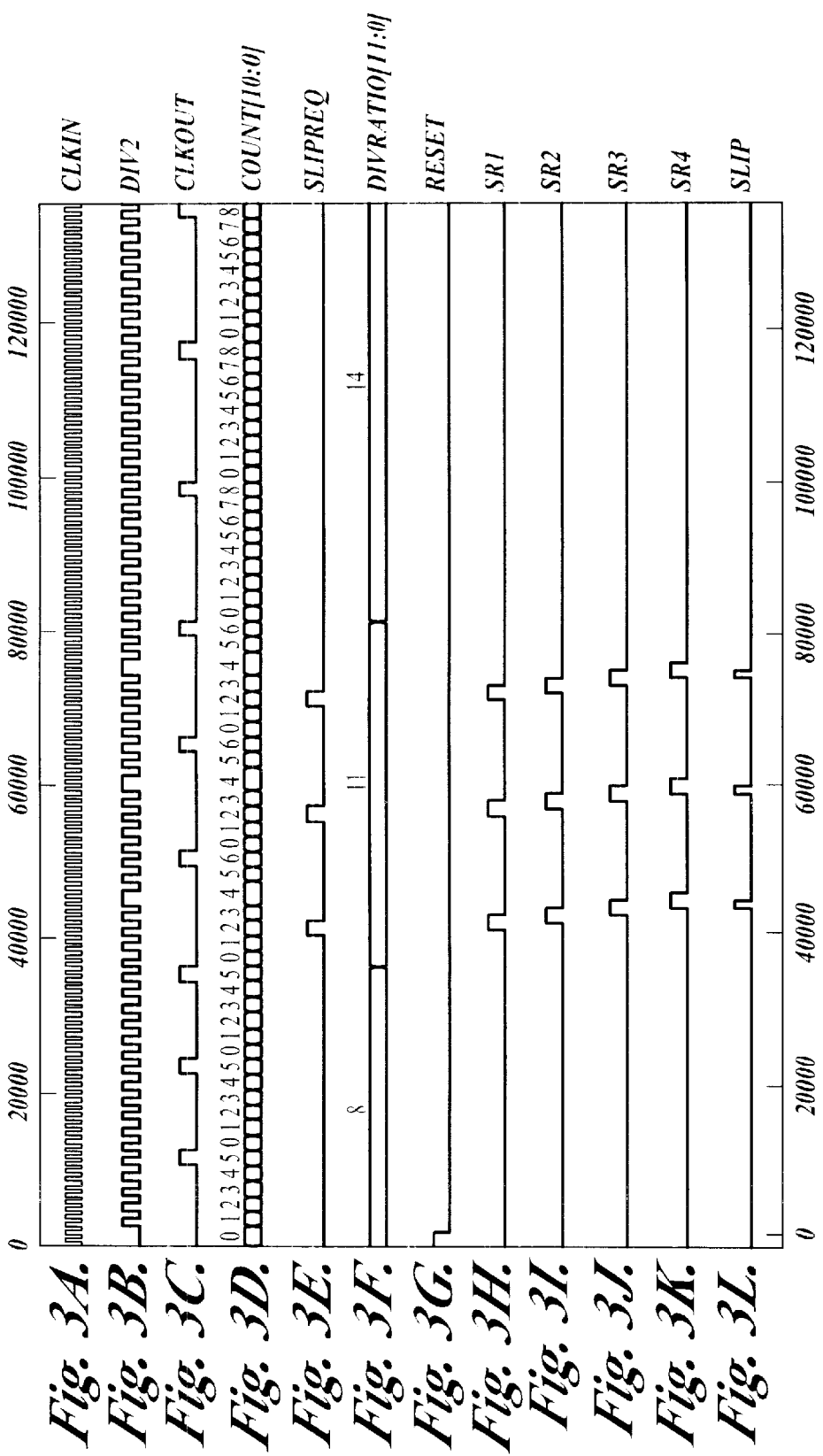
FIGS. 3A–3L illustrates an exemplary timing diagram for the frequency divider circuit shown in FIG. 2.

FIG. 2 shows a more detailed exemplary embodiment of a frequency divider circuit. Frequency divider circuit 200 includes synchronizer circuit 110, one-shot generator 120, toggle circuit 130, N-bit counter circuit 140, comparator circuits 150 and 160, and logic circuits 170 and 180. Synchronizer circuit 110 includes three flip-flop circuits (D1–D3). One-shot generator 120 includes two flip-flop circuits (D4, D5) and logic gate G1. Toggle circuit 130 includes logic gate G2 and flip-flop circuit D6. Logic circuit 170 includes flip-flop circuit D7. Logic circuit 180 includes logic gate G3 and flip-flop circuit D8.

Flip-flop circuit D1 includes a first input that is coupled to node N1, a second input that is coupled to node N17, and an output that is coupled to node N2. Flip-flop circuit D2 includes a first input that is coupled to node N1, a second input that is coupled to node N2, and an output that is coupled to node N3. Flip-flop circuit D3 includes a first input that is coupled to node N1, a second input that is coupled to node N3, and an output that is coupled to node N4. Flip-flop circuit D4 includes a first input that is coupled to node N1, a second input that is coupled to node N4, and an output that is coupled to node N5. Flip-flop circuit D5 includes a first input that is coupled to node N1, a second input that is coupled to node N6, and an output that is coupled to node N7. Flip-flop circuit D6 includes a first input that is coupled to node N1, a second input that is coupled to node N8, and an output that is coupled to node N9. Flip-flop circuit D7 includes a first input that is coupled to node N9, a second input that is coupled to node N12, and an output that is coupled to node N16. Flip-flop circuit D8 includes a first input that is coupled to node N9, a second input that is coupled to node N15, and an output that is coupled to node N17. Logic circuit G1 includes a first input that is coupled to node N4, a second input that is inversely coupled to node N5, and an output that is coupled to node N6. Logic circuit G2 includes a first input that is coupled to node N7, a second input that is coupled to node N9, and an output that is coupled to node N8. Logic circuit G3 includes a first input that is coupled to node N13, a second input that is coupled to node N14, and an output that is coupled to node N15. Comparator circuit 150 includes a first input that coupled to node N10, a second input that is coupled to node N11, and an output that is coupled to N12. Comparator circuit 160 includes an input that coupled to node N10 and an output that is coupled to node N13. N-bit counter 140 includes a first input that is coupled to node N9, a second input that is coupled to node N16, and an output that is coupled to node N10.

In operation, flip-flop circuits D1–D3 operate similarly to synchronizer circuit 110 shown in FIG. 1. Flip-flop circuit D1 produces an output signal (sr1) at node N2 an asynchronous slip request signal (slipreq) at node N17 when activated by the input clock signal (CLKin) at node N1. Flip-flop circuit D2 produces an output signal (sr2) at node N3 in response to the signal (sr1) at node N2 when activated by the input clock signal (CLKin). Flip-flop circuit D3 produces an output signal (sr3) at node N4 in response to the signal (sr2) at node N3 when activated by the input clock signal (CLKin).

Flip-flop circuits D1–D3 assist in synchronizing the input clock signal (CLKin) with the asynchronous slip request signal (slipreq) such that the input clock signal (CLKin) and the output (sr3) of flip-flop D3 have a phase relationship. Initially, the input clock signal (CLKin) and the asynchronous slip request signal (slipreq) have no phase relationship. The output of flip-flop circuit D3 attains a phase relationship with the input clock signal (CLK) as a high logic is registered in each flip-flop circuit (D1–D3) in response to the asynchronous slip request signal (slipreq).

In an alternative embodiment, a single flip-flop circuit may be used to synchronize the input clock signal (CLKin) with the asynchronous slip request signal (slipreq). However, with only one flip-flop circuit, there is a percentage chance that the arrival of the pulses for the asynchronous slip request signal (slipreq) and input clock signal (CLKin) will fail the setup and hold requirements of the single flip-flop circuit. A high logic level of the asynchronous slip request signal (slipreq) and a high logic level of the input clock signal (CLKin) may arrive at the same time resulting in meta-stability. Meta-stability refers to the single flip-flop circuit registering some mid-rail voltage in response to a high logic level for the asynchronous slip request signal (slipreq) rather than registering the high logic level. Using additional flip-flop circuits reduces the percentage chance that meta-stability will occur. The synchronizer circuit 100 shown in FIG. 2, uses three flip-flop circuits (D1–D3) to reduce meta-stability, however it may be appreciated that a greater or fewer number of flip-flop circuits may be used.

Flip-flop circuit D4, logic gate G1, and flip-flop circuit D5 operate similarly to one-shot generator 120 shown in FIG. 1.

Flip-flop circuit D4 produces an output signal (sr4) at node N5 in response to the signal (sr3) at node N4 when activated by the input clock signal (CLKin) at node N1. Logic gate G1 produces an output at node N6 in response to the signal (sr3) at node N4 and the inverse of the signal (sr4) at node N5. Flip-flop circuit D5 produces an output signal (slip) at node N7 in response to the signal at node N6 when activated by the input clock signal (CLKin).

Logic gate G1 is shown as an AND gate that includes an inverter on one input. Logic gate G1 produces a high logic level at node N6 in response to a low logic level at node N5 and high logic level at node N4. A low logic level is at node N5 and high logic level is at node N4 when the asynchronous slip request signal (slipreq) transitions to a high logic level. Flip-flop circuit D5 produces a pulse in the signal at node N7 (slip) in response to the high logic level at node N6. The width of the pulse matches the period of the input clock signal (CLKin). In the embodiment shown, a single pulse is produced at node N7 regardless of the duration that the asynchronous slip request signal (slipreq) remains at a high logic level.

Logic gate G2 and flip-flop circuit D6 operate similarly to toggle circuit 130 shown in FIG. 1. Logic gate G2 produces an output at node N8 in response to the signal (slip) at node N7 and the signal (div2) at node N9. Flip-flop D6 produces an output signal (div2) at node N9 in response to the input clock signal (CLKin) at node N1 and the signal at node N8.

Logic gate G2 is shown as an XNOR gate. Logic gate G2 inverts the output of flip-flop circuit D6 when the signal (slip) at node N7 remains at a low logic level (logic "0"), similar to an inverter. Accordingly, the output of flip-flop circuit D6 simply toggles with each rising edge of the input clock signal (CLKin) while the slip signal (slip) at node N7 remains a low logic level. Toggle circuit 130, therefore, operates similar to a divider circuit when the slip signal is a low logic level (i.e., inactive), dividing the input clock signal by a factor of 2 (e.g., the first factor) to produce a half-frequency signal (div2).

When the slip signal (slip) at node N7 transitions to a high logic level (i.e. active), the half-frequency signal (div2) does not change for a period of the input clock signal (CLKin). The output of logic gate G2 maintains the value at the output of flip-flop circuit D6. Accordingly, a transition for the output (div2) of flip-flop circuit D6 is skipped for one cycle of the CLKin signal, reducing the number of transitions of the div2 signal in comparison to the number of transitions of the CLKin signal by one. The relationships between the signals is shown in greater detail in FIGS. 3A–3L as described below.

N-bit counter circuit 140 shown in FIG. 2 operates similarly to N-bit counter circuit 140 shown in FIG. 1. N-bit counter circuit 140 produces output signals at node N10 in response to the signal (div2) at node N9 and a reset signal (reset) from node N16 that corresponds to the output clock signal (CLKout) of the frequency divider circuit 200. In one embodiment, N-bit counter circuit 140 is a synchronous N-bit counter circuit.

Comparator circuit 150 shown in FIG. 2 operates similarly to comparator circuit 150 shown in FIG. 1. Comparator circuit 150 produces an output signal at node N12 in response to a comparison of the count signal (count) at node N10 and the most significant bits of the divide ratio signal (divratio[N:1]) at node N11. The most significant bits include bits 1–N, excluding bit 0. Removing bit 0 operates similar to a divide-by-two. For example, if the desired divide ratio is 9 (binary 1001), the signal corresponding to node N11 is 4 (binary 100) when the least significant bit is removed. The divide ratio is shifted (divratio[N:1]) to correspond to the input clock signal (CLKin) being divided by a factor of 2 at node N9. A high logic level is produced at node N12 when the value of the bits at node N11 matches the values of the bits at node N10.

Comparator circuit 160 shown in FIG. 2 operates similarly to comparator circuit 160 shown in FIG. 1. Comparator circuit 160 produces an output signal at node N13 in response to a comparison of the count signal (count) at node N10 to a predetermined value "M". Accordingly, a high logic level is produced at node N12 when the value of the bits at node N10 matches the bits for predetermined value "M". In one embodiment, "M" corresponds to a binary value chosen to be less than the lowest value for the most significant bits of the divide ratio signal (divratio[N:1]). "M" ensures that an asynchronous slip request signal (slipreq) is generated once for each pulse of the output clock signal (CLKout). "M" is related to the programmable divide ratio "R" and the number bits "N" chosen for N-bit counter circuit 140.

As an example, the programmable divide ratio is chosen to be eight (e.g., R=8). A programmable divide ratio of eight has a binary value of "1000". Removing the least significant bit produces a binary value of "100" or four. Four is a 3-bit binary number. Accordingly, N=3 so that the counter may count to a binary value of "100". In this particular instance, "M" is chosen to be a binary value less than "100" (e.g., M<R/2) such that "M" is reached once for every instance the counter reaches the programmable divide ratio. If "M" were chosen to be larger than a binary value of "100" (e.g., M>R/2), "M" would not be reached by the counter before being reset.

Flip-flop circuit D7 operates similarly to logic circuit 170 shown in FIG. 1. Flip-flop circuit D7 produces the output clock signal (CLKout) at node N16 in response to the signal at node N12 when activated by the half-frequency signal (div2). The frequency (Fout) of the output clock signal (CLKout) corresponds to the frequency (Fin) of the input clock signal (CLKin) divided by programmable divide ratio "R" (e.g. Fin/R). In one embodiment, the relationship for the frequency divider circuit (200) may be described according to the following equation:

$$F\text{out}=(F\text{in}/2)/(R/2)=F\text{in}/R \quad (1)$$

Where R/2 is the functional divide ratio produced by N-bit counter circuit 140, comparator circuit 150, and logic circuit 170. Stated differently, N-bit counter circuit 140, comparator circuit 150, and logic circuit 170 functionally divide the half-frequency signal by a factor of "R/2". In certain embodiments, the divide ratio signal may need to be offset in response to design, layout, and pipeline considerations such that the functional divide ratio is "R+X" where X represents the offset. The offset (X) may be provided via N-bit counter circuit 140 (e.g., resetting to a count that is non-zero).

Logic gate G3 and flip-flop circuit D8 operate similarly to logic circuit 180 shown in FIG. 1. Logic gate G3 produces a signal at node N15 in response to the signal at node N13 and the least significant bit of the divide ratio signal (divratio[0]) at node N14. Flip-flop circuit D8 produces the asynchronous slip request signal (slipreq) at node N17 in response to the signal at node N15 and the signal (div2) at node N9.

Logic gate G3 is shown as an AND gate. Logic gate G3 produces a high logic level at node N15 when the bits at node N10 match the bits of binary value "M" and the least significant bit of the divide ratio signal (divratio[0]) is a high logic level. The high logic level at node N15 is registered in flip-flop D8, producing a pulse on the asynchronous slip request signal (slipreq). As previously stated, a pulse on the asynchronous slip request signal (slipreq) is processed through synchronizer circuit 110 and one-shot generator 120 to notify toggle circuit 130 to skip a transition of the half-frequency signal (div2). The skipped transition assists in producing an output clock signal (CLKout) with a frequency associated to the frequency of the input clock signal (CLKin) according to the selected divide ratio.

In one embodiment, the flip-flop circuits are D-type flip-flops. In another embodiment, N-bit counter circuit 140 and the divide ratio signal are represented in another format other than a binary, such as hexadecimal, or the like.

FIGS. 3A–3L illustrate an exemplary timing diagram for the frequency divider circuit shown in FIG. 2. The signals illustrated in FIGS. 3A–3L are exemplary signals for CLKin, div2, CLKout, slipreq, divratio, reset, sr1, sr2, sr3, sr4, and slip as shown in FIG. 2.

The timing diagram represents an exemplary simulation of the frequency divider circuit (200) shown in FIG. 2. The timing diagram depicts functional divide ratios corresponding to a functional divide ratio of divratio+4. The timing diagram includes exemplary divide ratios (divratio[11:0]) of 8, 11, and 14 as shown. Accordingly, the functional divide ratios are the exemplary divide ratios plus four, or 12, 15, and 18. Counts (count[10:0]) of 4, 5, and 7 result at the output of N-bit counter 140 when the least significant bit of the binary representation of these divide ratios (8, 11, 14) is removed. For example, in the example shown the count increments according to the half-frequency signal (div2). For a divide ratio of 8, the output clock signal (CLKout) occurs on the subsequent rising edge of div2 after the count has incremented to 4.

Divide ratios of 8 and 14 are examples of even divide ratios. As may be seen from the timing diagram and FIG. 2, a pulse of the asynchronous slip request signal (slipreq) is not generated for even divide ratios. A pulse of the asynchronous slip request signal (slipreq) is generated prior to each pulse of the output clock signal (CLKout) when the divide ratio is odd.

For the example where the divide ratio is 11, a pulse of the asynchronous slip request signal (slipreq) is generated prior to each pulse of the output clock signal (CLKout). The pulse of the asynchronous slip request signal (slipreq) is generated in response to each pulse in signals sr1, sr2, sr3, sr4, and slip. Signals sr1, sr2, sr3, sr4, and slip occur at incremented rising clock edges of the input clock signal (CLKin) in response to the asynchronous slip request signal (slipreq). The slip signal (slip) is produced by one-shot generator 120 and has a width that corresponds to a period of the input clock signal (CLKin). The half-frequency signal (div2) does not change for a period of the input clock signal (CLKin) in response to the slip signal (slip) being activated according to the output of logic gate G2. In the example shown, an output clock signal (CLKout) is produced that has a frequency that corresponds to the frequency of the input clock signal (CLKin) divided by 11. The present invention is therefore capable of dividing the frequency of a high frequency input clock signal to produce a lower frequency output clock signal according to a programmable divide ratio for both even and odd divide ratios.

Figure 4:
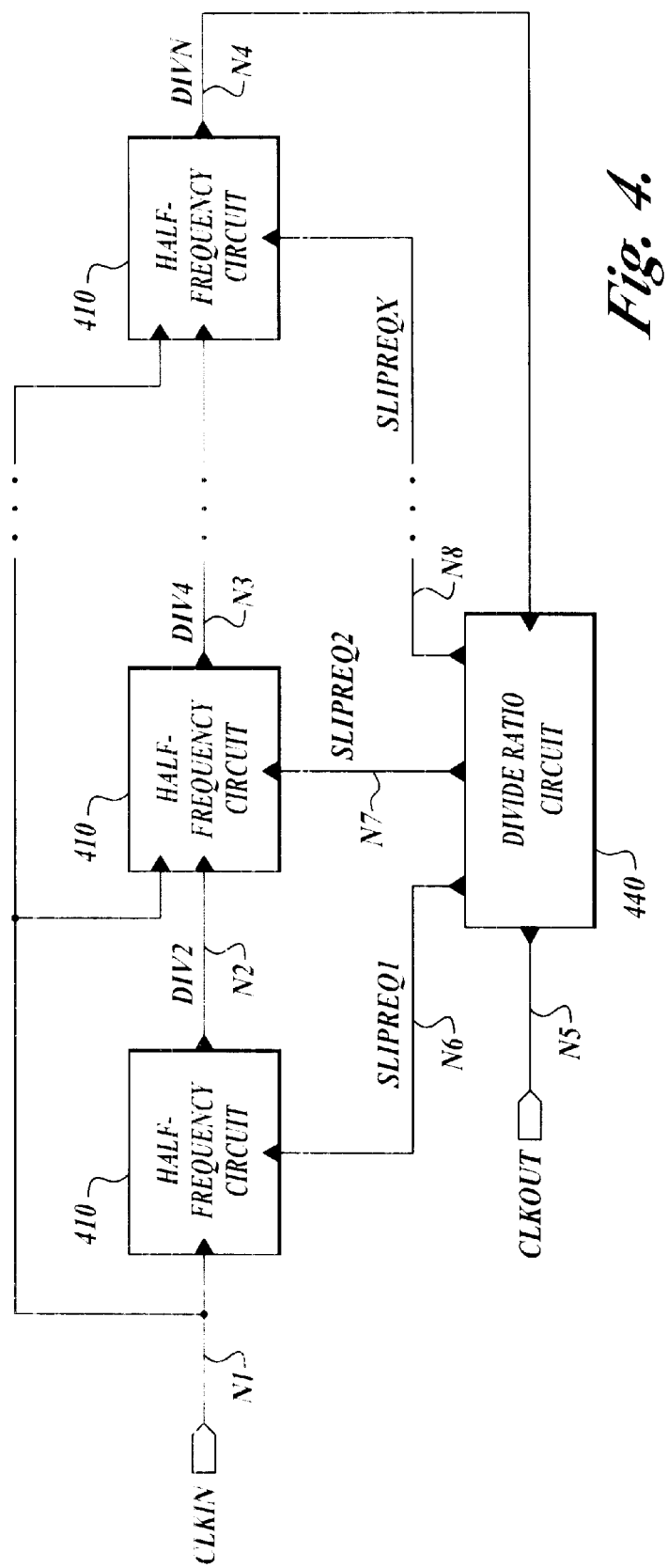
FIG. 4 shows another exemplary embodiment of a frequency divider circuit that includes cascaded portions to further divide a frequency of an input clock signal, in accordance with the present invention.

FIG. 4 shows another exemplary embodiment of a frequency divider circuit that includes cascaded portions to further divide a frequency of an input clock signal. In the present embodiment, the synchronizer circuit 110, one-shot generator 120, and toggle circuit 130 of FIG. 2 are collectively referred to as a half-frequency circuit (410), and N-bit counter circuit 140, comparator circuits 150 and 160, and logic circuits 170 and 180 are collectively referred to as a divide ratio circuit (440). The frequency divider circuit (400) of FIG. 4 includes "X" number of half-frequency circuits (410), and divide ratio circuit 440. Divide ratio circuit 440 includes "X" number of logic circuits (not shown) such as logic circuit 180. The additional circuits produce additional asynchronous slip request signals for each of the additional half-frequency circuits.

The first half-frequency circuit (410) produces a half-frequency signal (div2) at node N2 in response to the input clock signal (CLKin) at node N1, and the first asynchronous slip request signal (slipreq1) at node N6. The second half-frequency circuit (420) produces a divided-by-4 signal (div4) at node N3 in response to the input clock signal (CLKin) at node N1, the half-frequency signal (div2) at node N2, and the second asynchronous slip request signal (slipreq2) at node N7. The "Xth" half-frequency circuit (430) produces a divided-by-N signal (divN) at node N4, where N=2^X. The divided-by-N signal (divN) is produced in response to the input clock signal (CLKin) at node N1, the previously divided signal, and the "Xth" asynchronous slip request signal (slipreqX) at node N8. The divide ratio circuit (440) produces an output clock signal (CLKout) in response to the divided-by-N signal (divN).

For an example, if two half-frequency circuits are utilized, the input clock frequency would be divided by a factor of 4 when the slip signal is inactive, producing a divided-by-4 signal (div4). Also, two asynchronous slip request signals are utilized. In this example, when the asynchronous slip request signals (slipreq1 and slipreq2) are maintained at a low logic level (logic "0"), output clock signal (CLKout) has a frequency divided by the base multiple of 4 from the frequency of the input clock signal (CLKin). To compensate for non-multiples of the base multiple, the asynchronous slip request signals (slipreq1, slipreq2) correspond to the two least significant bits of the programmable divide ratio. Accordingly, output clock signal (CLKout) may have a frequency divided by any multiple by generating binary combinations of pulses for the two slip request signals (slipreq1, slipreq2). In one example, assume the programmable divide ratio is 15. When a programmable divide ratio of 15 is divided by the exemplary base multiple of 4, the remainder from the divide is 3. The numeral 3 is a two bit value (i.e., "11"), where each bit determines which of the two slip request signals (slipreq1, slipreq2) to produce (e.g., none, slipreq1, slipreq2, both). With a remainder of 3, both slip request signals (slipreq1, slipreq2) are produced. The asynchronous slip request signals (slipreq1, slipreq2) assist in producing the divide ratios that are not multiples of the divided-by-N signal (divN) (e.g., the base multiple). A pulse on each asynchronous slip request signal (slipreq1, slipreq2) results in a skipped transition of the half-frequency signal (div2) and the divide-by-4 signal (div4) respectively. The skipped transitions assist in producing an output clock signal (CLKout) with a frequency associated with the frequency of the input clock signal (CLKin) according to the selected divide ratio.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A method for dividing the frequency of an input clock signal according to a programmable divide ratio, comprising:

dividing the frequency of the input clock signal by a first factor to produce a divided signal when a slip signal is inactive;

producing an output signal by functionally dividing the frequency of the divided signal by a second factor to produce an output clock signal, wherein the second factor is determined by the programmable divide ratio divided by the first factor such that the frequency of the output clock signal is related to the frequency of the input clock signal and the programmable divide ratio; and generating an asynchronous slip request signal that activates the slip signal such that a transition of the divided signal is skipped when the programmable divide ratio is a non-multiple of the first factor.

2. The method of claim 1, further comprising synchronizing the asynchronous slip request signal with the input clock signal such that instances of meta-stability are reduced.

3. The method of claim 1, wherein the slip signal has a width of a period of the input clock signal, such that for each asynchronous slip request signal, a single transition of the divided signal is skipped.

4. The method of claim 1, further comprising toggling between a high logic level and low logic level for each period of the input clock signal to produce a half-frequency signal.

5. The method of claim 4, further comprising producing additional half-frequency signals by toggling between a high logic level and low logic level for each period of each proceeding half-frequency signal, wherein the last half-frequency signal corresponds to the divided signal.

6. The method of claim 1, wherein the frequency of the input clock signal is related to the frequency of the output clock signal according to the following equation:

$$F\text{out}=F\text{in}/R$$

where Fout is the frequency of the output clock signal, Fin is the frequency of the input clock signal, and R is the programmable divide ratio.

7. The method of claim 1, further comprising producing a count signal that increments to a factor that corresponds to the most significant bits of the programmable divide ratio.

8. The method of claim 7, wherein a pulse occurs on the output clock signal during a period of the divide signal after the count signal reaches the factor that corresponds to the most significant bits of the programmable divide ratio.

9. The method of claim 7, further comprising producing the asynchronous slip request signal when the least significant bit of the programmable divide ratio is a high logic level and the count signal has reached a predetermined value.

10. An apparatus for dividing a first frequency of an input clock signal according to a programmable divide ratio, comprising:

a half-frequency circuit that is arranged to produce a half-frequency signal in response to the input clock signal when a slip signal is inactive, wherein the half-frequency signal corresponds to a divide signal that has a second frequency that is determined by the first frequency divided by a base multiple; and a divide ratio circuit that is arranged to produce an output clock signal and an asynchronous slip request signal, wherein the asynchronous slip request signal activates the slip signal such that a transition of the divided signal is skipped when the programmable divide ratio is a non-multiple of base multiple, such that the output clock signal has an associated third frequency corresponding to a programmable divide ratio of the first frequency.

11. An apparatus as in claim 10, wherein the half-frequency circuit further comprises:

a synchronizer circuit that is arranged to synchronize the asynchronous slip request signal with the input clock signal such that an output of the synchronizer circuit has a determinable phase relationship with the input clock signal;

a one-shot generator that is arranged to produce the slip signal, wherein the slip signal includes a pulse corresponding to a rising edge of the asynchronous slip request signal; and a toggle circuit that is arranged to produce the divide signal, wherein the divide signal toggles for each period of the input clock signal when the slip signal is inactive.

12. An apparatus as in claim 10, wherein the divide ratio circuit further comprises:

a counter circuit that is arranged to produce a count signal dependent on the programmable divide ratio;

a first comparator circuit that is arranged to compare the count signal to the most significant bits of the programmable divide ratio;

a first logic circuit that is arranged to produce the output clock signal in response to the comparison of the first comparator circuit;

a second comparator that is arranged to compare the count signal to a predetermined value; and a second logic circuit that is arranged to produce the asynchronous slip request signal in response to the comparison of the second comparator circuit and the least significant bit of the programmable divide ratio.

13. The apparatus of claim 10, further comprising additional half-frequency circuits in a cascade configuration, wherein each additional half-frequency circuit produces an additional half-frequency signal successively in response to an output of each previous half-frequency circuit.

14. The apparatus of claim 13, wherein the divide ratio circuit further comprises additional logic circuits corresponding to the number of additional half-frequency circuits, wherein the additional logic circuits are arranged to produce additional asynchronous slip request signals.

15. An apparatus for dividing the frequency of an input clock signal according to a programmable divide ratio, comprising:

means for dividing that are arranged to divide the frequency of the input clock signal by a first factor to produce a divided signal when a slip signal is inactive;

means for producing an output signal that are arranged to functionally divide the divided signal by a second factor to produce an output clock signal, wherein the second factor is determined by the programmable divide ratio divided by the first factor such that the frequency of the output clock signal is related to the frequency of the input clock signal and the programmable divide ratio; and means for generating an asynchronous slip request signal that are arranged to generate an asynchronous slip request signal that activates the slip signal such that a transition of the divided signal is skipped when the programmable divide ratio is a non-multiple of the first factor.

16. The apparatus of claim 1, further comprising means for synchronizing that are arranged to synchronize the asynchronous slip request signal with the input clock signal such that instances of meta-stability are reduced.

17. The apparatus of claim 1, further comprising means for generating a pulse that are arranged to generate a pulse that has a width of a period of the input clock signal, such that for each asynchronous slip request signal, a single transition of the divided signal is skipped.

18. The apparatus of claim 1, further comprising means for producing a count signal that are arranged to produce a count signal that increments to a factor that corresponds to the most significant bits of the programmable divide ratio.

19. The apparatus of claim 18, wherein a pulse occurs on the output clock signal for the following period of the divide signal after the count signal reaches the factor that corresponds to the most significant bits of the programmable divide ratio.

20. The apparatus of claim 18, further comprising means for producing the asynchronous slip request signal that are arranged to produce the asynchronous slip request signal when the least significant bit of the programmable divide ratio is a high logic level and the count signal has reached a predetermined value.

* * * * *

UNITED STATES PATENT AND TRADEMARK OFFICE
CERTIFICATE OF CORRECTION

PATENT NO.   : 6,667,638 B1
DATED        : December 23, 2003
INVENTOR(S)  : Kramer et al.

It is certified that error appears in the above-identified patent and that said Letters Patent is hereby corrected as shown below:

Column 13,
Line 5, please change "1" to -- 15 --.
Line 9, please change "1" to -- 15 --.
Line 14, please change "1" to -- 15 --.

Signed and Sealed this

Seventeenth Day of August, 2004

JON W. DUDAS
*Acting Director of the United States Patent and Trademark Office*